United States Patent [19]

Shigemura et al.

[11] Patent Number: 5,348,590
[45] Date of Patent: Sep. 20, 1994

[54] SURFACE TREATING AGENT FOR COPPER OR COPPER ALLOYS

[75] Inventors: Seizi Shigemura, Hadano; Hitoshi Oka, Yokohama; Motokazu Shindo, Hadano, all of Japan

[73] Assignees: Hitachi, Ltd., Tokyo; Hitachi Computer Electronics, Hando, both of Japan

[21] Appl. No.: 113,705

[22] Filed: Aug. 31, 1993

[30] Foreign Application Priority Data

Aug. 31, 1992 [JP] Japan .................. 4-230933

[51] Int. Cl.$^5$ .............................. B23K 35/34
[52] U.S. Cl. ...................... 148/23; 228/223
[58] Field of Search .................. 148/23-25; 228/223

[56] References Cited

U.S. PATENT DOCUMENTS

| 5,127,571 | 7/1992 | Gutierrez | 148/25 |
| 5,176,749 | 1/1993 | Costello | 148/23 |

FOREIGN PATENT DOCUMENTS

| 46-17046 A | 5/1971 | Japan . |
| 49-26183 A | 7/1974 | Japan . |
| 56-18077 B | 4/1981 | Japan . |
| 61-41988 B | 9/1986 | Japan . |
| 2-93079 A | 4/1990 | Japan . |
| 4-72072 A | 3/1992 | Japan . |

*Primary Examiner*—Peter D. Rosenberg
*Attorney, Agent, or Firm*—Antonelli, Terry, Stout & Kraus

[57] ABSTRACT

A preflux for a printed circuit board is provided, and the preflux has an excellent heat resistance adapted to a method of surface mounting electronic parts on the printed circuit board, and it is highly operable and reliable. The preflux is comprised mainly of a 2-alkylbenzimidazole derivative having the general formula of

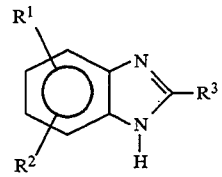

wherein $R^1$ and $R^2$ may be identical with or different from each other and are hydrogen atom, a lower alkyl group or a halogen atom, and $R^3$ is an alkyl group of three or more carbon atoms, and contains a chelating agent reacting with copper ions added thereto. Addition of a proper amount of the chelating agent to the preflux makes it easy to form a highly heat-resistant film of the preflux only on copper or copper alloy patterns without masking the printed contacts and joint land. The chelating agent reacts with copper ions and selected from the group consisting of ethylene diamine triacetic acid, diethylene triamine pentaacetic acid, nitrylotriacetic acid, iminodiacetic acid, 1,2-cyclohexanediamine tetraacetic acid and glycolether diamine tetraacetic acid.

4 Claims, 2 Drawing Sheets

SURFACE TREATING AGENT FOR COPPER OR COPPER ALLOYS

BACKGROUND OF THE INVENTION

1. Field of the Invention

The present invention relates to a preflux having an improved operability and performance and comprised mainly of a 2-alkylbenzimidazole derivative having a good heat resistance, more particularly to a preflux suitable for surface treatment of copper or copper alloy patterns on a hard printed circuit board or flexible printed circuit board.

2. Description of Related Art

The art of this type has been proposed by, for example, JP 56-18077B and JP 4-72072A.

JP 56-18077B discloses a preflux comprised mainly of an imidazole derivative and further containing a chelating agent reacting with copper ions. Treatment of a printed circuit board with the preflux allows copper ions to release from the circuit board and react with the chelating agent to form a copper complex which is then removed out. Therefore, an anticorrosive film made of imidazole compounds can be formed only on copper or copper alloy patterns in printed circuit boards having printed contacts made of gold, platinum, silver, tin or rhodium and thus no masking is required on the printed contacts. The prior art forms a very thin, for example, 0.1–0.5 μm thick film of an imidazole compound on an exposed area of the copper or copper alloy pattern on the printed circuit board. A main one of prior art electronic part-joining methods has been a pin or lead insertion mounting method. The film of the imidazole compound preflux functions as an anticorrosive film for copper or copper alloy patterns until the patterns are subjected to flow soldering. The preflux film is dissolved by a postflux which is used in pretreatment for the flow soldering to expose a clean copper or copper alloy area which is susceptible to the flow soldering.

However, in recent years, a surface mounting method has often been used as methods of joining electronic parts to printed circuit boards. Therefore, the printed circuit boards are repeatedly exposed to high temperatures in pre-setting of chip parts, soldering of surface mounted parts and flow soldering of inserted parts and chip parts. This causes the preflux film of the imidazole compound to be degraded by heat in pre-setting chip parts or soldering surface mounted parts. Therefore, in the subsequent flow soldering, the dissolution of the preflux film with the postflux is reduced, so that a residual amount of the preflux film disadvantageously prevents the solderability of the copper or copper alloy patterns.

In the prior art method above, reduction of the imidazole derivative is easily effected at a concentration of copper ions released from printed circuit boards in the preflux solution of 10 ppm or higher. Thus, the anticorrosive film of the imidazole compound is formed also on the surfaces of printed contacts made of gold, platinum, silver, tin or rhodium, so that the function of the printed contacts is lost.

However, there is a small amount of increase in the contact resistance of the printed contact made of gold even at a copper ion concentration of less than 10 ppm. From this it can be presumed that a minor amount of the imidazole compound is precipitated on the surface of the printed contact. In recent years, the highdensity packaging on printed circuit boards has been required and accordingly formation of multileads and fining of lead pitches have been developed. Thus, there is a tendency that used amounts of parts to be surface mounted, such as a tape automated bonding (TAB), chip on board (COB) or flip chip, is increasing. When such parts are to be joined to the copper pattern on printed circuit board, the pattern is necessary to be plated with gold, silver, aluminum, tin or a solder. Since the joint surface area between the copper pattern and the leads of the parts is very small, the surface of the copper pattern to be plated is required to be highly clean in order to secure the reliability of lead joint. Where the copper ion concentration is less than 10 ppm, a minor amount of imidazole compounds precipitated has an adverse influence on the reliability of lead joint.

JP 4-72072A discloses a preflux comprising an aqueous solution containing a 2-alkylbenzimidazole derivative, organic acid and zinc or a zinc compound. Films of the 2-alkylbenzimidazole derivatives are disclosed by, for example, JP 46-17046B, JP 49-26183B and JP 61-41988B. The derivatives are thermally more stable than films of 2-long-chain-alkylbenzimidazoles and have adequate heat resistance for the method of surface mounting on printed circuit boards.

Furthermore, addition of zinc or a zinc compound can further improve the heat resistance. In the prior art, the 2-alkylbenzimidazole derivatives in the preflux are reduced by reaction with copper or copper alloy patterns in printed circuit boards and thus the films of the 2-alkylbenzimidazole derivatives are formed only on the copper or copper alloy patterns, while the surfaces of the patterns are oxidized, so that the copper is dissolved in copper ions into the preflux. On the other hand, when the concentration of the dissolved copper ions exceeds 10 ppm in the preflux, the reduction of the 2-alkylbenzimidazole derivatives becomes remarkably easy and the films of the 2-alkylbenzimidazole derivatives may also be formed on the printed contacts made of gold, platinum, silver, tin, rhodium or the like, or on the joint land of the surface mounted parts, made of gold, silver, aluminum, tin, a solder or the like, thereby disadvantageously reducing the reliability of lead joint.

In recent years, more leads have been given to an electronic part to be surface mounted and lead pitches have been made finer for high density packaging. Thus, this provides a tendency that the employed amounts of the parts to be surface mounted, such as tape automated bonding (TAB), chip on board (COB), flip chips and the like, increase. The joint land on printed circuit board of such parts. Such parts to be surface mounted are plated with gold, silver, aluminum, tin, a solder or the like. Surface treatment of the partially plated copper patterns at the leads thereof with gold, silver, aluminum, tin or a solder will increasingly be important in future.

Furthermore, a solution of the prior art preflux contains copper ions released from the copper pattern of printed circuit board accumulated therein. As the concentration of copper ions in the preflux solution increases, the speed at which the preflux film is precipitated on the copper pattern of printed circuit board, also increases. Therefore, there is a tendency that as the number of the printed circuit boards treated increases, the preflux film becomes thicker within a given treatment time. In recent years, surface-mounted printed circuit boards are repeatedly subjected to various soldering steps at high temperatures, such as soldering of surface mounting parts, pre-setting of chip parts, flow soldering of insert or chip parts. Therefore, in the case where the preflux film gets excessively thick, the preflux film is inadequately dissolved when brought into contact with a postflux at the flow-soldering stage, so that the solderability of the copper pattern is degraded. Moreover, soldering without cleaning, in which no cleaning of printed circuit boards with a solvent is conducted after the soldering under regulation of solvents, employs a postflux having a low activity. Therefore, in the case where the preflux film gets excessively thick, the solderability of the copper pattern is degraded. From this it is seen to be important that the preflux film is stably precipitated and thickness of the preflux film is controlled.

SUMMARY OF THE INVENTION

An object of the present invention is to provide a preflux comprised mainly of a compound having a better thermal stability than such prior imidazole derivatives as disclosed by JP 56-18077B, thereby giving a heat resistance required by a method of surface mounting electronic parts on printed circuit boards, to a film of the preflux formed on the copper or copper alloy patterns of the printed circuit boards.

Another object of the present invention is to provide a preflux which is free of the defects of the 2-alkylbenzimidazole preflux as disclosed by JP 4-72072A and able to easily be formed in a film form only on the copper or copper alloy patterns of printed circuit boards without masking on printed contacts made of gold, platinum, silver, tin rhodium, etc. and joint lands of surface mounted parts, made of gold, silver, aluminum, tin, a solder, etc.

DETAILED DESCRIPTION OF PREFERRED EMBODIMENTS

Figure 1:
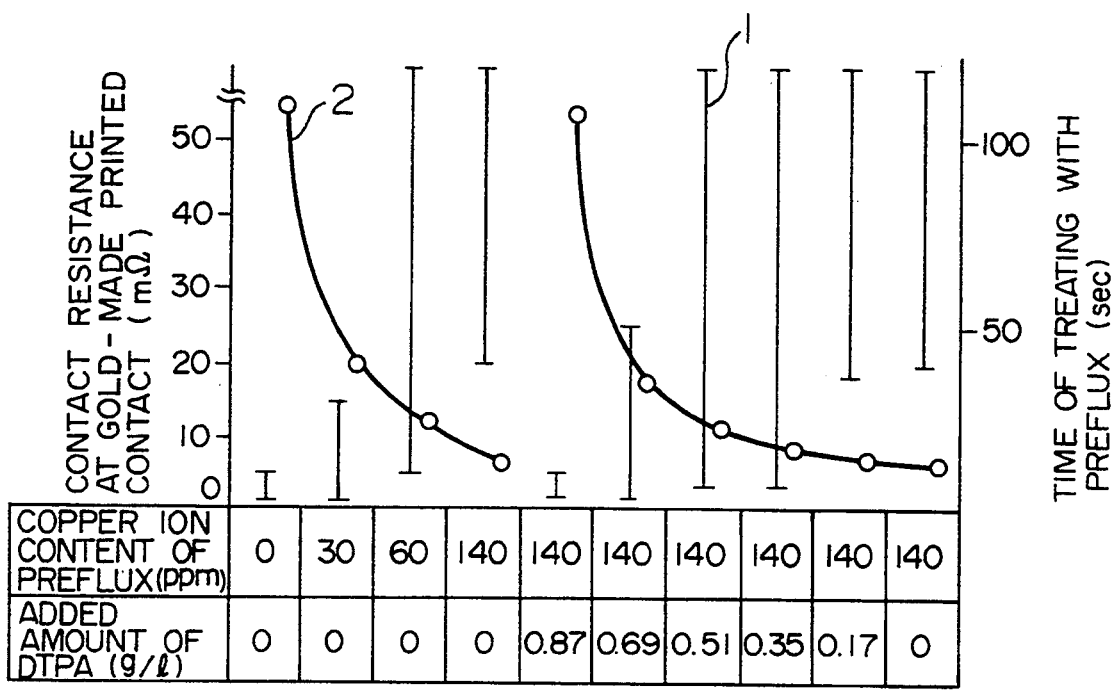
FIG. 1 is a graph showing the dependency of each of a contact resistance of gold-made printed contacts of a printed circuit board and a time of treating with a 2-alkylbenzimidazole derivative preflux upon each of a copper ion content in an aqueous solution of the preflux and an added amount of diethylene triamine pentaacetic acid (DTPA), when a 0.2 μm thick film of the preflux was formed on the printed circuit board.

In order to overcome the problems of JP 56-18077B, the present inventors have found that the main component of the preflux should be a 2-alkylbenzimidazole derivative having a general formula of

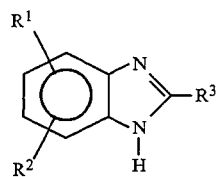

wherein $R^1$ and $R^2$ may be identical with or different from each other and are hydrogen atom, a lower alkyl group or a halogen atom, and $R^3$ is an alkyl group of three or more carbon atoms.

The 2-alkylbenzimidazole derivatives suitable for practice of the present invention may be 2-propylbenzimidazole, 2-butylbenzimidazole, 2-pentylbenzimidazole, 2-hexylbenzimidazole, 2-heptylbenzimidazole, 2-octylbenzimidazole, 2-nonylbenzimidazole, 2-undecylbenzimidazole, 2-isobutylbenzimidazole, 2-(1-methylbutyl)benzimidazole, 2-(1-ethylpropyl)benzimidazole, 2-(1-ethylpentyl)benzimidazole, 2-(2,2-dimethylpropyl)benzimidazole, 2-(3-methylbutyl)benzimidazole, 2-(2-propylbutyl)benzimidazole, 4-methyl-2-heptylbenzimidazole, 4-chloro-2-octylbenzimidazole, 4,5-dimethyl-2-pentylbenzimidazole, 4,5-dichloro-2-hexylbenzimidazole, 4-methyl-2-(1-ethylpentyl)benzimidazole, 4-chloro-2-(3-methylbutyl)benzimidazole and salts thereof. In practicing the present invention is preferably used a water-soluble salt obtained by reacting the 2-alkylbenzimidazole derivative with an organic acid.

Furthermore, in order to overcome the problems of JP 4-72072A, the present inventors have found that to the preflux of the 2-alkylbenzimidazole derivatives should be added one or more of chelating agents for reacting with copper ions, of aminocarboxylic acids such as ethylene diamine triacetic acid, diethylene triamine pentaacetic acid, nitrylotriacetic acid, iminodiacetic acid, 1,2-cyclohexanediamine tetraacetic acid and glycolether diamine tetraacetic acid, and metal salts thereof.

The 2-alkylbenzimidazole derivatives as a main component of the preflux of the present invention are thermally more stable than the 2-long-chain-alkylimidazole such as GLICOAT L or GLICOAT S made by Shikoku Kasei Kogyo Co., Ltd. because of a conjugated benzene ring contained in the molecule of the derivatives. Therefore, the film formed on the surface of the copper or copper alloy patterns of the printed circuit boards has a satisfactory heat resistance adapted to the surface mounting method for printed circuit boards.

Furthermore, the presence of the chelating agent reacting with copper ions in the 2-alkylbenzimidazole preflux makes it possible to remove away the copper ions released from the printed circuit boards in a form of complex compounds with the chelating agent during the treatment with the preflux. Therefore, the printed contacts made of gold, platinum, silver, tin, rhodium, etc. and the joint land of parts to be surface mounted, made of gold, silver, aluminum, tin, a solder, etc., are not required to be masked for treatment of printed circuit boards with a preflux, and the film of the 2-alkylbenzimidazole derivatives can easily be formed only on the copper or copper alloy patterns.

That is, the present invention is based on the principle as mentioned above and hence not limited to only the aminocarboxylic acid as the chelating agent. Thus, in the present invention, there may be used all copper ions-chelating agents which can prevent reaction of the imidazole derivatives with copper ions. The aminocarboxylic acid is merely preferred as one which can contain a high concentration of copper ions. The amount of the chelating agent reacting with copper ions added to the preflux of the 2-alkylbenzimidazole derivatives is preferably by up to $3 \times 10^{-3}$ mol/l more than the content of copper ions contained in the preflux. If the increased amount of the chelating agent in the preflux is more than $3 \times 10^{-3}$ mol/l, the formation of the 2-alkylbenzimidazole derivative film on the copper or copper alloy patterns of printed circuit boards is excessively inhibited, so that the treatment with the preflux may be carried out for too a long period of time to put the preflux to practical use.

The present invention will be illustrated below with reference to some examples and the drawings attached hereto.

EXAMPLE 1

FIG. 1 shows the dependency of each of a contact resistance 1 of gold-made printed contacts of a printed circuit board and a time 2 of treating with a 2-alkylbenzimidazole derivative preflux (GLICOAT-SMD, made by Shikoku Kasei Kogyo Co., Ltd.) upon each of a copper ion content in an aqueous solution of the preflux and an added amount of DTPA, when a 0.2 μm thick film of the preflux was formed on the printed circuit board. At a copper ion content of 0 ppm, the gold-made printed contacts treated with the preflux had the same contact resistance as that of the clean printed contacts not treated with the preflux. This shows that no deposition of the preflux was made on the gold-made printed contacts. However, at a copper ion content exceeding 0 ppm, the contact resistance increased and the preflux film was formed on the gold-made printed contacts. However, at a copper ion content of 140 ppm, addition of an amount of DTPA equal to the molar content of the copper ions did not cause any preflux film to be formed on the gold-made printed contacts, so that the printed contacts had the same contact resistance as that of the clean printed contacts. As the molar content of copper ions becomes higher than that of DTPA, the contact resistance increases. From this it is seen that addition to a preflux solution of DTPA in an amount equal to or higher than the molar concentration of copper ions in the solution causes no amount of the preflux to deposit on the gold-made printed contacts, in other words, keeps the printed contacts clean. However, the DTPA should not be added in an amount exceeding by more than $3 \times 10^{-3}$ mol/l (1.2 g/l) more than the content of copper ions contained in the preflux solution, because formation of the preflux film on copper or copper alloy patterns is extremely inhibited and it requires too long a period of time to treat the patterns with the preflux and thus the addition of such an amount of DTPA is not put to practical use.

Figure 2:
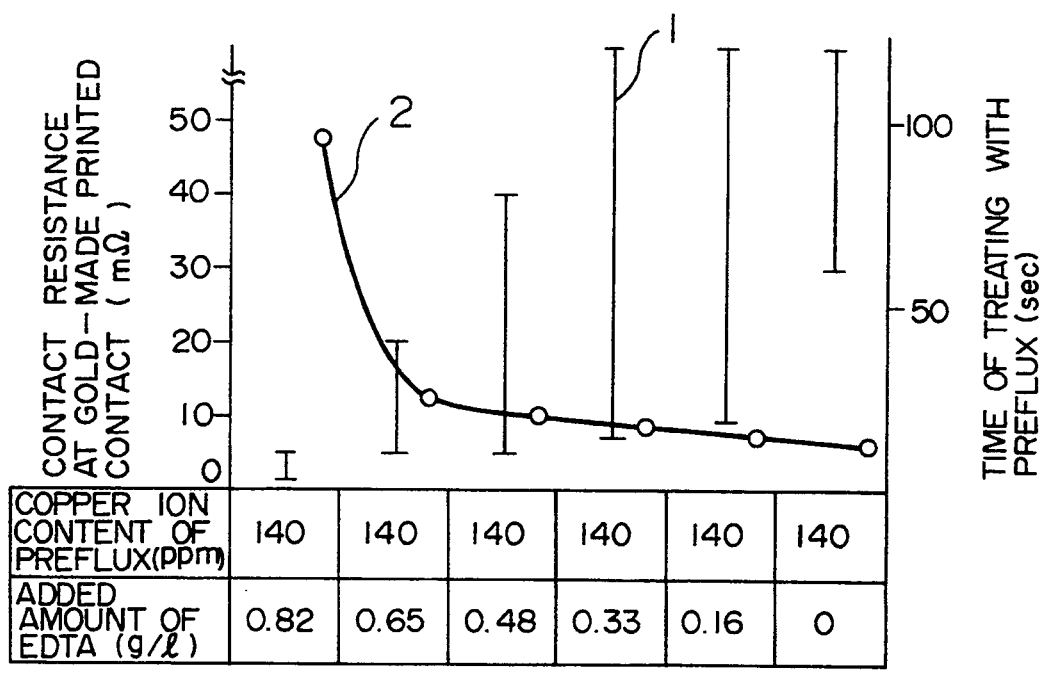
FIG. 2 is a graph showing the dependency of each of a contact resistance of gold-made printed contacts of a printed circuit board and a time of treating with a 2-alkylbenzimidazole derivative preflux upon an added amount of ethylene diamine tetraacetic acid (EDTA) at a copper ion content of 140 ppm in an aqueous solution of the preflux, when a 0.2 μm thick film of the preflux was formed on the printed circuit board.

FIG. 2 shows the dependency of each of a contact resistance 1 of gold-made printed contacts of a printed circuit board and a time 2 of treating with a 2-alkylbenzimidazole derivative preflux (GLICOAT-SMD, made by Shikoku Kasei Kogyo Co., Ltd.) upon an added amount of EDTA, when the copper ion content in an aqueous solution of the preflux was constantly 140 ppm and a 0.2 μm thick film of the preflux was formed on the printed circuit board. From FIG. 2, it is seen that no preflux film was formed and the treated printed contacts had the same contact resistance as that of a clean printed contact before the treatment with the preflux even at a copper ion content of 140 ppm contained in the preflux, when a larger amount of EDTA than the molar content of the copper ions was added. From this, it is seen that addition to a preflux solution of DTPA in an amount equal to or higher than the molar concentration of copper ions in the solution causes no amount of the preflux to deposit on the gold-made printed contacts, in other words, keeps the printed contacts clean. However, the EDTA should not be added in an amount exceeding by more than $3 \times 10^{-3}$ mol/l (1.1 g/l) more than the content of copper ions contained in the preflux, because the addition of such an amount of EDTA is not put to practical use.

Table 1 below shows the thickness of a preflux film deposited on a copper pattern of a printed circuit board when dipped for one minute into a solution containing a 2-alkylbenzimidazole preflux but no amount of DTPA added thereto, while changing the copper ion content of the solution.

Table 2 below shows the thickness of a preflux film deposited on a copper pattern of a printed circuit board when dipped for two minutes into 0.87 g/l of DTPA added thereto, while changing the copper ion content of the solution.

TABLE 1

| Cu ion content (ppm) | 0 | 60 | 120 | 140 |
|---|---|---|---|---|
| Amount of DTPA (g/l) | 0 | 0 | 0 | 0 |
| Preflux thickness (μm) | 0.14 | 0.28 | 0.33 | 0.40 |

TABLE 2

| Cu ion content (ppm) | 0 | 60 | 120 | 140 |
|---|---|---|---|---|
| Amount of DTPA (g/l) | 0.87 | 0.87 | 0.87 | 0.87 |
| Preflux thickness (μm) | 0.17 | 0.18 | 0.20 | 0.21 |

From Table 1, it is seen that as the copper ion content raises, there is a tendency that the thickness of the preflux film increases. When the copper ion content reached 140 ppm, the thickness of the preflux film increased to be about 3 times as large as that at the copper ion content of 0 ppm. This change in the thickness of the preflux film is beyond the tolerable range with respect to the solderability of printed circuit boards. Thus, the solderability of printed circuit boards is degraded. Therefore, it is necessary to stabilize the deposition of preflux films.

Table 2 also shows that as the copper ion content raises there is a tendency that the thickness of the preflux film increases. That is, when the copper ion content reached 140 ppm, the thickness of the preflux film increased to be about 1.2 times as large as that at the copper ion content of 0 ppm. When compared with Table 1 showing the preflux solution containing no amount of DTPA added, it is seen that there is a less change in the thickness of the preflux film. This shows that the deposition of preflux films is stabilized. Moreover, this change is within the tolerable range with respect to the solderability of printed circuit boards. Thus, the preflux solution containing an amount of DTPA is adequate to be put into practice.

Figure 3:
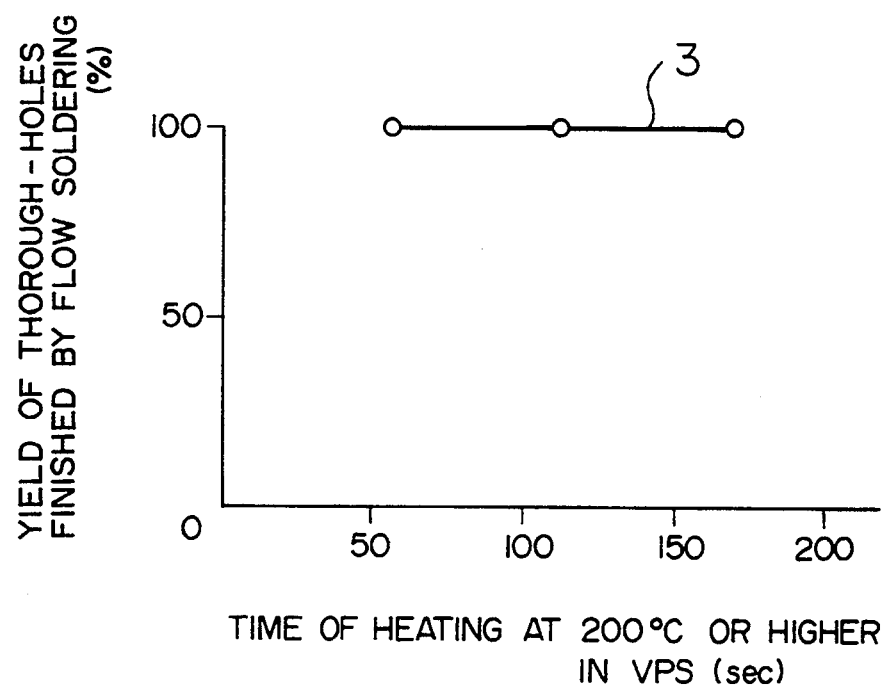
FIG. 3 is a graph showing a relation between a heating time in vapor phase soldering (VPS) at a temperature of 200° C. or higher and a yield of throughholes finished by flow soldering after the VPS, when a 2-alkylbenzimidazole derivative preflux film of about 0.2 μm in thickness was formed on a copper pattern on a printed circuit board of 1.6 mm in thickness.

Based on the foregoing, a preflux film of about 0.2 μm in thickness was formed on a copper pattern on a printed circuit board of 1.6 mm in thickness and having gold-made printed contacts. The preflux used was comprised of an aqueous copper ion-free solution containing a 2-alkylbenzimidazole derivative preflux (GLICOAT-SMD, made by Shikoku Kasei Kogyo, Co., Ltd.) and 0.4 g/l of DTPA. No preflux film was formed on the gold-made printed contacts. FIG. 3 shows a relation between a heating time in vapor phase soldering (VPS) at a temperature of 200° C. or higher and a yield 3 of through-holes finished by flow soldering after the VPS (three times; 170 seconds), when the 2-alkylbenzimidazole derivative preflux film of about 0.2 μm in thickness was formed on the copper pattern on the printed circuit board of 1.6 mm in thickness. From FIG. 3, it is seen that the yield of through-holes was not changed to be 100% even when the VPS was three times carried out. This means that the preflux of the present invention is highly suitable for the surface mounting method. Moreover, it is seen that the above mentioned 2-alkylbenzimidazole preflux with DTPA added thereto does not permit any preflux film to form on copper patterns of printed circuit boards but only on the copper patterns, until the content of copper ions released from the copper patterns is 65 ppm in the aqueous preflux solution during the use thereof for a long period of time.

As is clear from the foregoing, when a printed circuit board having printed contacts made of gold, platinum, silver, tin, rhodium, etc. and a joint land made of gold, silver, aluminum, a solder, etc. provided thereon is treated with a 2-alkylbenzimidazole derivative preflux, addition of a proper amount of a chelating agent reacting with copper ions to the preflux makes it easy to form a film of the preflux only on copper or copper alloy patterns without masking the printed contacts and joint lands and it possible to maintain the high reliability of joining of the printed contacts and joint land, because the addition makes it to possible to stabilize the deposition of the preflux film and control the thickness of the preflux film.

What is claimed is:

1. A surface treating agent for copper or a copper alloy, which comprises a preflux comprised predominantly of a 2-alkylbenzimidazole derivative having the general formula of

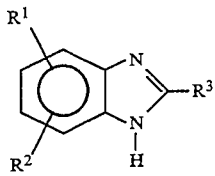

wherein $R^1$ and $R^2$ may be identical with or different form each other and are hydrogen atom, a lower alkyl group or a halogen atom, and $R^3$ is an alkyl group of three or more carbon atoms, and contains one or more chelating agents for reacting with copper ions, added thereto, said chelating agent being selected from the group consisting of aminocarboxylic acids and metal salts thereof; said chelating agent being added to said surface treating agent in an amount of by at most $3 \times 10^{-3}$ mol/l larger than the content of copper ions released in said preflux from the copper or copper alloy during the treatment of the copper or copper alloy with the surface treating agent.

2. The surface treating agent according to claim 1, wherein the chelating agent is selected from the group consisting of ethylene diamine triacetic acid, diethylene triamine pentaacetic acid, nitrylotriacetic acid, iminodiacetic acid, 1,2-cyclohexanediamine tetraacetic acid and glycolether diamine tetraacetic acid.

3. A process for surface treating copper or a copper alloy, which comprises bringing the surface of copper or a copper alloy into contact with a surface treating agent comprising a preflux comprised predominantly of a 2-alkylbenzimidazole derivative having the general formula of

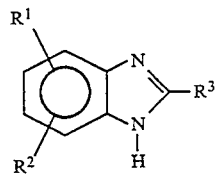

wherein $R^1$ and $R^2$ may be identical with or different form each other and are hydrogen atom, a lower alkyl group or a halogen atom, and $R^3$ is an alkyl group of three or more carbon atoms, and contains one or more chelating agents for reacting with copper ions, added thereto, said chelating agent being selected from the group consisting of aminocarboxylic acids and metal salts thereof; said chelating agent being added to said surface treating agent in an amount of by at most $3 \times 10^{-3}$ mol/l larger than the content of copper ions released in said preflux from the copper or copper alloy during the treatment of the copper or copper alloy with the surface treating agent.

4. The process according to claim 3, wherein the chelating agent is selected from the group consisting of ethylene diamine triacetic acid, diethylene triamine pentaacetic acid, nitrylotriacetic acid, iminodiacetic acid, 1,2-cyclohexanediamine tetraacetic acid and glycolether diamine tetraacetic acid.

* * * * *